US012660257B2

(12) United States Patent
Mun et al.

(10) Patent No.:    US 12,660,257 B2
(45) Date of Patent:        Jun. 16, 2026

(54) GALVANIC ISOLATION USING ISOLATION BREAK BETWEEN REDISTRIBUTION LAYER ELECTRODES

(71) Applicant: GlobalFoundries Singapore Pte. Ltd., Singapore (SG)

(72) Inventors: Bong Woong Mun, Singapore (SG); Wanbing Yi, Singapore (SG); Juan Boon Tan, Singapore (SG); Jeoung Mo Koo, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 370 days.

(21) Appl. No.: 18/354,941

(22) Filed: Jul. 19, 2023

(65) Prior Publication Data

US 2023/0361173 A1      Nov. 9, 2023

Related U.S. Application Data

(62) Division of application No. 17/644,626, filed on Dec. 16, 2021, now Pat. No. 11,791,379.

(51) Int. Cl.
H10D 62/10          (2025.01)
H10W 10/00          (2026.01)
(Continued)

(52) U.S. Cl.
CPC ........  H10D 62/115 (2025.01); H10W 10/014 (2026.01); H10W 10/17 (2026.01); H10W 20/43 (2026.01); H10W 70/698 (2026.01)

(58) Field of Classification Search
CPC ............ H10D 62/115; H01L 21/76224; H01L 23/147; H01L 23/528; H01L 24/13;
(Continued)

(56) References Cited

U.S. PATENT DOCUMENTS 7,361,571 B2    4/2008  Nam
7,470,991 B2   12/2008  Larkin et al.
(Continued)

FOREIGN PATENT DOCUMENTS

CN        103383933 A    11/2013
CN        112420661 A     2/2021

OTHER PUBLICATIONS

Extended European Search report from corresponding European Patent Application No. 23204518.7, dated Apr. 17, 2024, 11 pages.
(Continued)

*Primary Examiner* — Patricia D Valenzuela
(74) *Attorney, Agent, or Firm* — Francois Pagette; Hoffman Warnick LLC

(57)        ABSTRACT

A structure includes a galvanic isolation including a horizontal portion including a first redistribution layer (RDL) electrode in a first insulator layer, and a second RDL electrode in the first insulator layer laterally spaced from the first RDL electrode. An isolation break includes a trench defined in the first insulator layer between the first RDL electrode and the second RDL electrode, and at least one second insulator layer in the trench. The first insulator layer and the second insulator layer(s) are between the first RDL electrode and the second RDL electrode. The isolation may separate, for example, voltage domains having different voltage levels. A related method is also disclosed. The isolation may also include a vertical portion using the first RDL electrode and another electrode in a metal layer separated from the first RDL electrode by a plurality of interconnect dielectric layers.

4 Claims, 6 Drawing Sheets

(51) Int. Cl.
| | |
|---|---|
| *H10W 10/17* | (2026.01) |
| *H10W 20/43* | (2026.01) |
| *H10W 70/698* | (2026.01) |

(58) Field of Classification Search
CPC ... H01L 2224/0236; H01L 2224/02371; H01L 2224/02375; H01L 2224/02381; H01L 23/5223; H01L 23/53295; H01L 24/05; H01L 23/485; H10W 10/014; H10W 10/17; H10W 20/43; H10W 70/698; H10W 70/65; H10W 70/652; H10W 70/654; H10W 70/68; H10W 72/20; H10W 20/47; H10W 72/90; H10W 20/496; H10W 20/40

See application file for complete search history.

(56) References Cited

U.S. PATENT DOCUMENTS

| | | | |
|---|---|---|---|
| 8,659,149 | B2 | 2/2014 | French et al. |
| 8,957,500 | B2 | 2/2015 | Dubois et al. |
| 9,299,697 | B2 | 3/2016 | West et al. |
| 9,380,705 | B2 | 6/2016 | Chen |
| 10,020,239 | B2 | 7/2018 | Tsao et al. |
| 10,211,147 | B2 | 2/2019 | Zhang et al. |
| 10,672,795 | B2 | 6/2020 | Singh et al. |
| 11,031,303 | B1 | 6/2021 | Shih et al. |
| 11,158,640 | B2 | 10/2021 | Sugioka et al. |
| 11,211,283 | B2 | 12/2021 | Singh et al. |
| 11,469,194 | B2 | 10/2022 | Colpani et al. |
| 11,637,105 | B2 | 4/2023 | Sugioka et al. |
| 11,764,273 | B2 | 9/2023 | Mun et al. |
| 11,791,379 | B2 | 10/2023 | Mun et al. |
| 2003/0067052 | A1 | 4/2003 | Matsuo et al. |
| 2003/0207532 | A1 | 11/2003 | Chudzik et al. |
| 2006/0027890 | A1 | 2/2006 | Yang et al. |
| 2010/0258869 | A1 | 10/2010 | Morita et al. |
| 2011/0233666 | A1 | 9/2011 | Lui et al. |
| 2013/0087914 | A1 | 4/2013 | Yang et al. |
| 2016/0163749 | A1 | 6/2016 | Yang et al. |
| 2017/0263696 | A1* | 9/2017 | West ....................... H10D 1/00 |
| 2018/0323133 | A1 | 11/2018 | Kirby |
| 2019/0326509 | A1* | 10/2019 | Yi ........................... H10B 61/00 |
| 2020/0006386 | A1 | 1/2020 | Singh et al. |
| 2021/0074675 | A1 | 3/2021 | Shini |
| 2022/0165658 | A1 | 5/2022 | Mun et al. |
| 2022/0254740 | A1 | 8/2022 | West |
| 2023/0005818 | A1 | 1/2023 | Lee et al. |
| 2023/0361173 | A1 | 11/2023 | Mun et al. |
| 2024/0243058 | A1 | 7/2024 | Mun et al. |

OTHER PUBLICATIONS

U.S. Appl. No. 18/155,890, filed Dec. 29, 2022, 34 pages.
U.S. Appl. No. 18/155,890, Office Action dated May 14, 2025, 12 pages.
U.S. Appl. No. 18/428,035, filed Jan. 31, 2024, entitled "Structure With Capacitive Junction Between Silicide Layer and Electrode And Related Method,", 37 Pages.
U.S. Appl. No. 18/155,890, Amendment to Office Action filed Aug. 14, 2025, 8 pages.
U.S. Appl. No. 18/155,890, Notice of Allowance dated Nov. 18, 2025, 9 pages.

* cited by examiner

GALVANIC ISOLATION USING ISOLATION BREAK BETWEEN REDISTRIBUTION LAYER ELECTRODES

CROSS-REFERENCE TO RELATED APPLICATIONS

The present application is a divisional of U.S. patent application Ser. No. 17/644,626, filed Dec. 16, 2021, currently pending. The entire contents of the foregoing is incorporated herein by reference.

BACKGROUND

The present disclosure relates to integrated circuits, and more specifically, to a structure with a galvanic isolation including an isolation break between redistribution layer electrodes, and a related method.

A galvanic isolation is an isolation that prevents a first circuit from electrically communicating direct current (DC) and unwanted alternating current (AC) with a second circuit, but allows the two circuits to communicate through other mechanisms such as optics, inductance, capacitance, or other means. The two circuits are typically at different electrical voltages, e.g., a high-voltage and a low-voltage. Galvanic isolations are created by forming a parallel-plate capacitor using electrodes in different metallization layers of the integrated circuit, such as different metallization layers in the back-end-of-line (BEOL) interconnect layers. The dielectrics of the BEOL layers separate the electrodes to form the capacitor. For higher voltage applications, the thickness of BEOL dielectric layers or the number of BEOL dielectric layers are increased to provide a higher breakdown voltage. As devices have increased in voltages, e.g., into the kilo-Volt range, the available space to add dielectric thickness or increase the number of dielectric layers to create a reliable and strong galvanic isolation is limited.

SUMMARY

An aspect of the disclosure is directed to a structure, comprising: a galvanic isolation including a horizontal portion including: a first redistribution layer (RDL) electrode in a first insulator layer; a second RDL electrode in the first insulator layer laterally spaced from the first RDL electrode; and an isolation break including a trench defined in the first insulator layer between the first RDL electrode and the second RDL electrode and at least one second insulator layer in the trench, wherein the first insulator layer and the at least one second insulator layer are between the first RDL electrode and the second RDL electrode.

Another aspect of the disclosure includes a structure, comprising: a high-voltage domain on a substrate; a low-voltage domain on the substrate operating at a lower voltage than the high-voltage domain; a galvanic isolation isolating the high-voltage domain from the low-voltage domain, the galvanic isolation including a horizontal portion including: a first redistribution layer (RDL) electrode in a first insulator layer over one of the high-voltage and low-voltage domains; a second RDL electrode in the first insulator layer laterally separated from the first RDL electrode and operatively coupled to the other of the high-voltage and low-voltage domains; and an isolation break including a trench defined in the first insulator layer between the first RDL electrode and the second RDL electrode, and at least one second insulator layer in the trench, wherein the first insulator layer and the at least one second insulator layer are between the first RDL electrode and the second RDL electrode.

An aspect of the disclosure related to a method comprising: forming a trench into a first insulator layer between a first redistribution layer (RDL) electrode and a second RDL electrode in the first insulator layer, the first RDL electrode and the second RDL electrode being laterally spaced; and filling the trench with at least one second insulator layer, wherein the first insulator layer and the at least one second insulator layer are between the first RDL electrode and the second RDL electrode, wherein the first RDL electrode is in a first voltage domain, and the second RDL electrode is in a second, different voltage domain.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
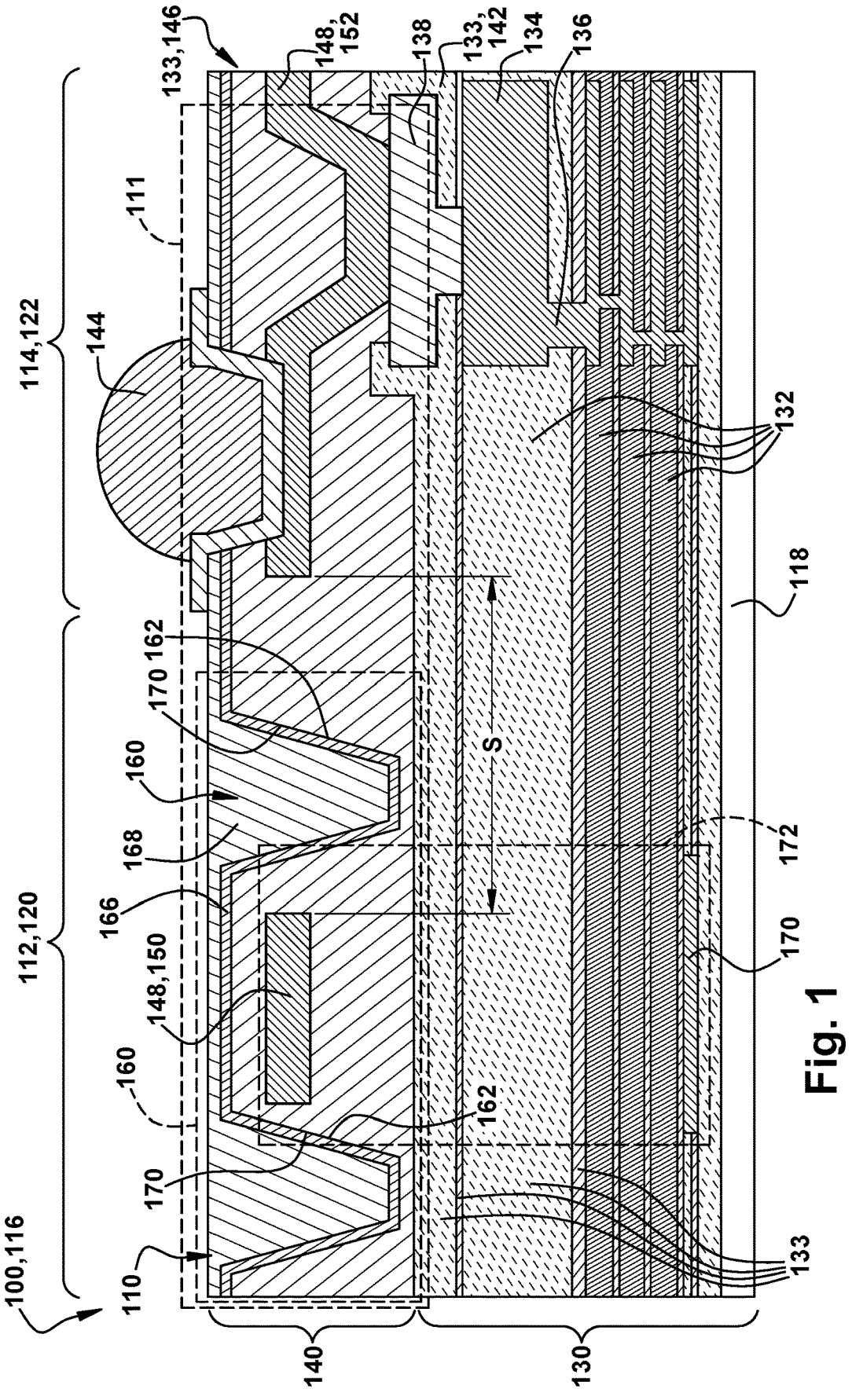
FIG. 1 shows a cross-sectional view of a structure including a galvanic isolation, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a galvanic isolation including a horizontal portion including a first redistribution layer (RDL) electrode in a first insulator layer, and a second RDL electrode in the first insulator layer laterally spaced from the first RDL electrode. The first insulator layer may include a polyimide over far back-end-of-line interconnect layers in an integrated circuit structure. An isolation break includes a trench defined in the first insulator layer between the first RDL electrode and the second RDL electrode and at least one second insulator layer in the trench. The first insulator layer and the second insulator layer(s) are between the first RDL electrode and the second RDL electrode. The isolation may separate, for example, voltage domains having different voltage levels. A related method is also disclosed. The galvanic isolation may also include a vertical portion using the first RDL electrode and a third electrode in a metal layer and separated from the first RDL electrode by a plurality of interconnect dielectric layers.

The galvanic isolation provides a stronger (e.g., kilo-Volt level) galvanic isolation by increasing capacitive coupling using the isolation break and RDL electrodes in a horizontal portion in the far BEOL interconnect layers. The galvanic isolation provides stronger protection than available with more or thicker BEOL interconnect layers. The horizontal (lateral) portion of the isolation also prevents lateral spiking of the high voltage contact on the bond pad. The first insulator layer, which can be a polyimide packaging layer, can be made thinner than conventionally used, or can be made thicker to obtain higher galvanic isolation, when required. The formation process is compatible with complementary metal-oxide semiconductor (CMOS) processing, but has lower cost than increasing BEOL interconnect layer thicknesses or numbers.

Figure 2:
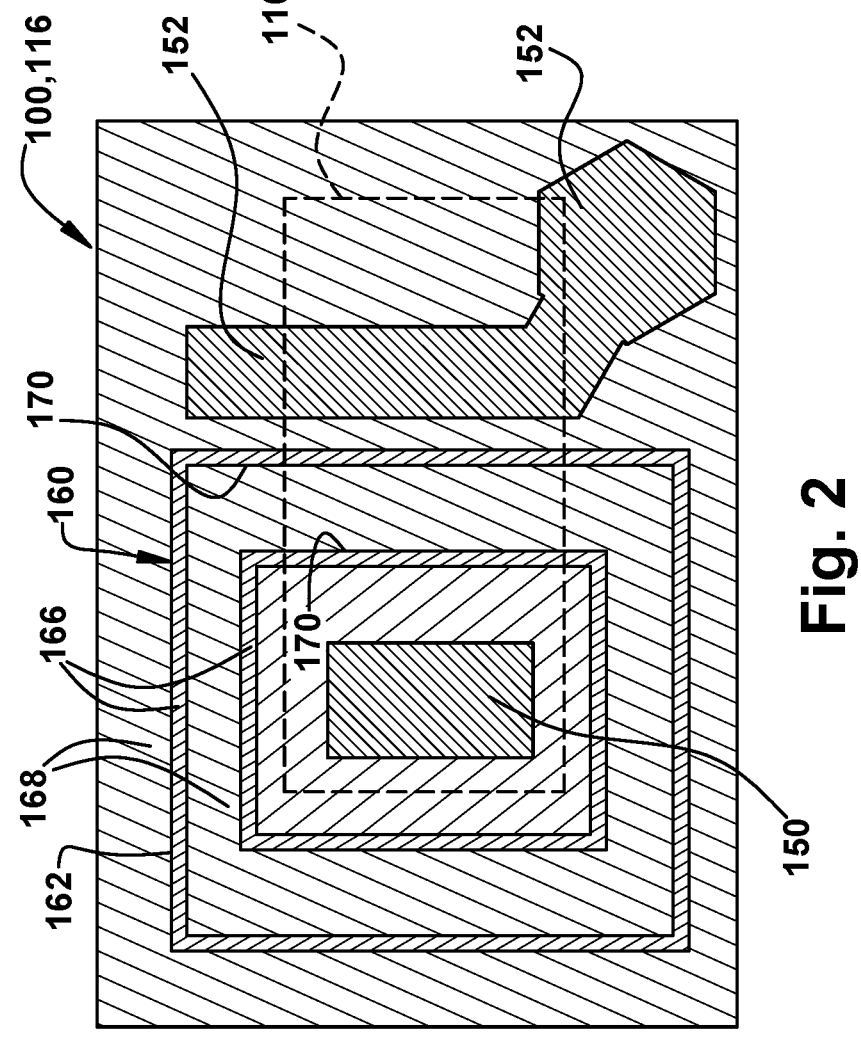
FIG. 2 shows a top down view of a structure including a galvanic isolation, according to embodiments of the disclosure.

FIG. 1 shows a cross-sectional view and FIG. 2 shows a top down view of a structure 100 according to embodiments of the disclosure. Structure 100 includes a galvanic isolation 110 (hereafter "isolation 110") including a horizontal portion 111. As shown in FIG. 1, isolation 110 is, at least in part, in a galvanic isolation region 112 adjacent a logic region 114 in an integrated circuit (IC) structure 116. Logic region 114 may include any now known or later developed integrated circuit functional elements (not shown) formed over a substrate 118, such as but not limited to: transistors (below M1 layer), resistors, capacitors, etc. Galvanic isolation region 112 may represent a first voltage domain 120, and logic region 114 may represent a second voltage domain 122. First voltage domain 120 and second voltage domain 122 have different operative voltages. For example, first voltage domain 120 may be a relatively high-voltage domain on substrate 118 and second voltage domain 122 may be a relatively low-voltage domain on substate 118. In any event, second voltage domain 122 operates at a lower voltage than first voltage domain 120.

Any now known or later developed back-end-of-line (BEOL) interconnect layers 130 may be provided in logic region 114 and in galvanic isolation region 112. It is noted that BEOL interconnect layers 130 may include any now known or later developed interlayer dielectric (ILD) layers 132 with conductive wire 134 or via 136 electrical interconnects therein for electrically interconnecting parts in, for example, logic region 114. ILD layers 132 may include but are not limited to: silicon dioxide; silicon nitride; carbon-doped silicon dioxide materials; fluorinated silicate glass (FSG); organic polymeric thermoset materials; silicon oxy-carbide; SiCOH dielectrics; spin-on glasses; silsesqui-oxanes; and any silicon-containing low-k dielectric. Wires 134 and vias 136 may include any appropriate conductor, e.g., tungsten, cobalt, copper, aluminum, etc., and any appropriate liner, e.g., tantalum nitride, tantalum, etc. While a certain number of BEOL interconnect layers 130 are illustrated, any number may be used, and they may have any thickness desired to accommodate the structures therein. BEOL interconnect layers 130 scale electrical interconnects, e.g., wires 134 and vias 136, until the structures, such as input/output pads 138, are large enough to interconnect to external structure of IC structure 116. BEOL interconnect layers 130 may also include outermost BEOL interconnect layers 133, which may be referred to as far BEOL (FBEOL) layers.

Structure 100 includes a redistribution layer (RDL) 140 over an outermost ILD layer 142 including I/O pads 138 (only one of the latter shown for clarity). RDL 140 and ILD layer 142 may be part of FBEOL layers 133 because they are the outermost interconnect layers in IC structure 116. RDL 140 is an extra metal layer on an IC die that makes I/O pads 138 of IC structure 116 available in other locations of the die for better accessibility to I/O pads 138, where necessary. An RDL 140 spreads the contact points around IC structure 116 so that solder balls 144 can be applied, and thermal stress can be distributed. RDL 140 includes a first insulator layer 146 including metal wires 148 therein to move the contact points to different locations than I/O pads 138. First insulator layer 146 may include any now known or later developed dielectric appropriate for an RDL 140. In one embodiment, first insulator layer 146 includes a polyimide. First insulator layer 146 thus may have a dielectric strength of, for example, approximately 300 root mean square voltage per micrometer (Vrms/μm).

Structure 100, employing select metal wires 148 in RDL 140, includes a first redistribution layer (RDL) electrode 150 in first insulator layer 146, and a second RDL electrode 152 in first insulator layer 146 laterally spaced from first RDL electrode 150. First RDL electrode 150 and second RDL electrode 152 are part of RDL 140, the latter of which may include other metal wires 148, not shown. "Electrode" as used herein may include any conductor capable of providing an electrical plate for a capacitor. First RDL electrode 150 and second RDL electrode 152 are at the same level in first insulator layer 146. Hence, first RDL electrode 150 and second RDL electrode 152 may be horizontally or laterally spaced apart a distance S, which can be user defined. As is conventional, other parts of metal wires 148 in RDL 140 can be at different levels for interconnection purposes, e.g., to I/O pads 138 or other structure. RDL electrodes 150, 152 can have any desired lateral layout. In the example shown, second RDL electrode 152 may be electrically coupled by a plurality of (BEOL) interconnect layers 130 to second voltage domain 122, e.g., in logic region 114. As noted, first voltage domain 120 and second voltage domain 122 may have different operative voltages. For example, first voltage domain 120 may be a relatively high-voltage domain and second voltage domain 122 may be a relatively low-voltage domain.

Structure 100 also includes an isolation break 160. Isolation break 160 electrically isolates first RDL electrode 150 and second RDL electrode 152. As shown in FIG. 1, isolation break 160 includes a trench 162 defined in first insulator layer 146 between first RDL electrode 150 and second RDL electrode 152. At least one second insulator layer 166, 168 is in trench 162. Hence, first insulator layer 146 and at least one second insulator layer 166, 168 are between first RDL electrode 150 and second RDL electrode 152. Each second insulator layer 166, 168 has a higher dielectric constant than first insulator layer 146. In one embodiment, the second insulator layer(s) may include at least one nitride layer 166 and at least one oxide layer 168. In the example shown, at least one nitride layer 166 lines a sidewall 170 of trench 162, and at least one oxide layer 168 fills a remaining portion of trench 162. However, other arrangements of nitride and oxide are possible. In this manner, as shown best in FIG. 2, isolation break 160 includes a nitride-oxide-nitride arrangement between first RDL electrode 150 and second RDL electrode 152, which increases the capacitive coupling created by isolation 110 compared to vertical galvanic isolations using BEOL interconnect layers 130. Nitride layer(s) 166 may include but are not limited to silicon nitride, and oxide layer(s) 168 may include but are not limited to silicon oxide. As shown in FIG. 2, trench 162 and isolation break 160 surrounds first RDL electrode 150.

Isolation break 160 provides additional dielectric strength, and hence increased capacitive coupling for isolation 110. The use of nitride layer(s) 166 and oxide layer(s) 168 allow for further increasing and/or customization of the dielectric strength of isolation 110. For example, silicon nitride has a dielectric strength of approximately 1100 Vrms/$\mu$m and silicon oxide (high temperature version) has a dielectric strength of approximately 500 Vrms/$\mu$m—compared to the approximately 300 Vrms/$\mu$m of polyimide. The type of materials, the thicknesses thereof and width of trench 162 can all be customized to provide a desired dielectric strength for isolation break 160, and desired capacitive coupling of isolation 110. Other options for second insulator layer(s) 166, 168 may include but are not limited to: hydrogenated silicon oxycarbide (SiCOH) (~750 Vrms/$\mu$m) or porous SiCOH (750+ Vrms/$\mu$m). The type silicon oxide can also vary and may include, for example, tetraethyl orthosilicate, $Si(OC_2H_5)_4$ (TEOS) silicon oxide (~900 Vrms/$\mu$m) or low temperature silicon oxide (~500 Vrms/$\mu$m).

As shown in FIG. 1, structure 100 and isolation 110 may also include a vertical portion 172. Vertical portion 172 may include a third electrode 170 under first RDL electrode 150 and in a metal layer (M1, M2, etc.) of first voltage domain 120. While third electrode 170 is shown in a first metal layer M1, it may be in any metal layer in BEOL interconnect layers 130. Third electrode 170 is vertically separated from first RDL electrode 140 by a plurality of ILD layers 132 of BEOL interconnect layers 130, forming a vertical portion 172 of galvanic isolation 110. Any number of ILD layers 132 may be used.

Figure 3:
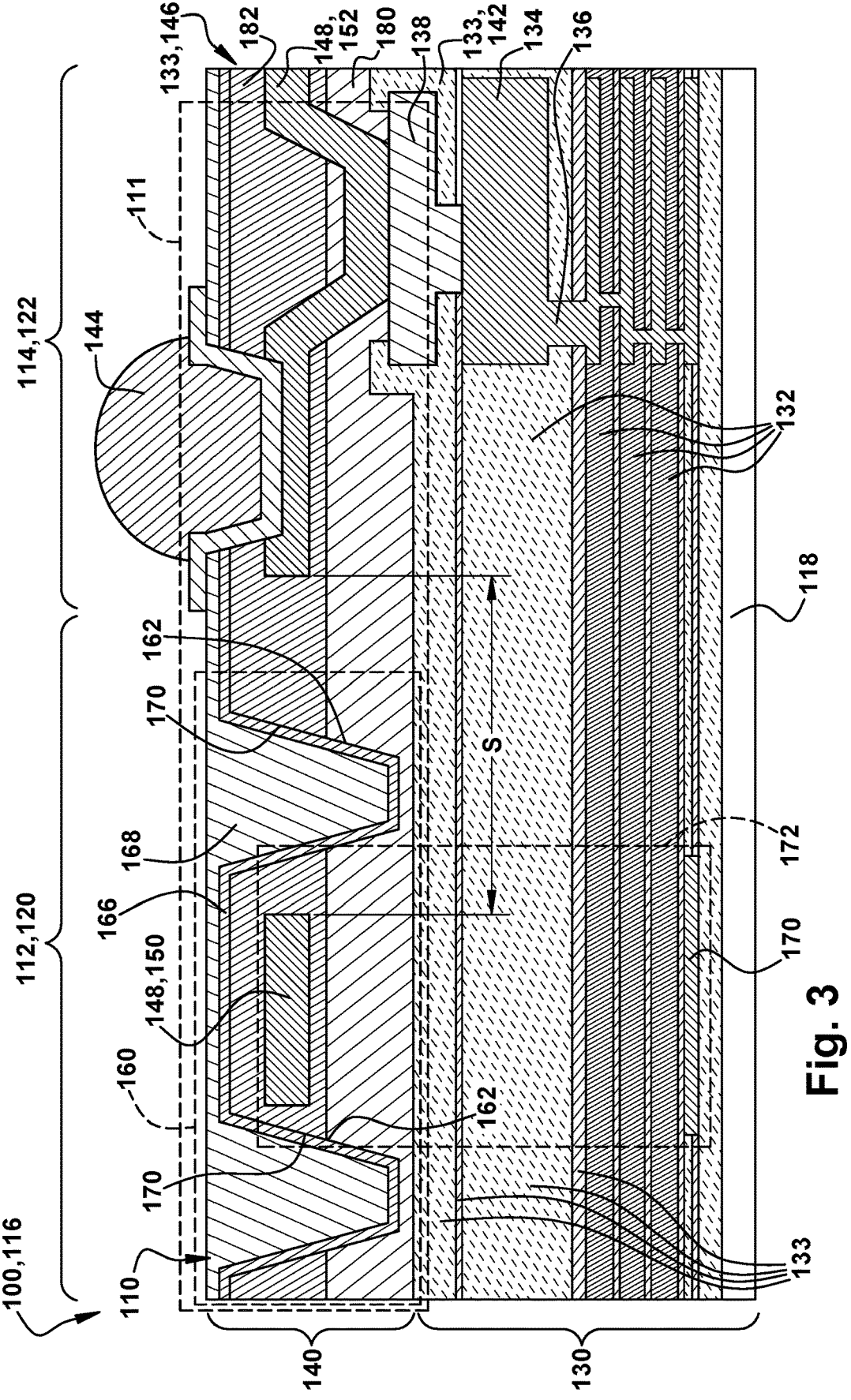
FIG. 3 shows a cross-sectional view of a structure including a galvanic isolation, according to other embodiments of the disclosure.

FIG. 3 shows a cross-sectional view of structure 100 according to an alternative embodiment. Structure 100 in FIG. 3 is substantially similar to that of FIG. 1, except first insulator layer 146 includes at least one nitride layer 180 and at least one oxide layer 182, i.e., formed horizontally across regions 112, 114. That is, nitride layer(s) 180 and oxide layer(s) 182 replace polyimide. Isolation break 160 still extends into trench 162 in nitride layer(s) 180 and oxide layer(s) 182. The use of nitride layer(s) 180 and oxide layer(s) 182 allow for further increasing and/or customization of the dielectric strength of isolation 110.

Figure 4:
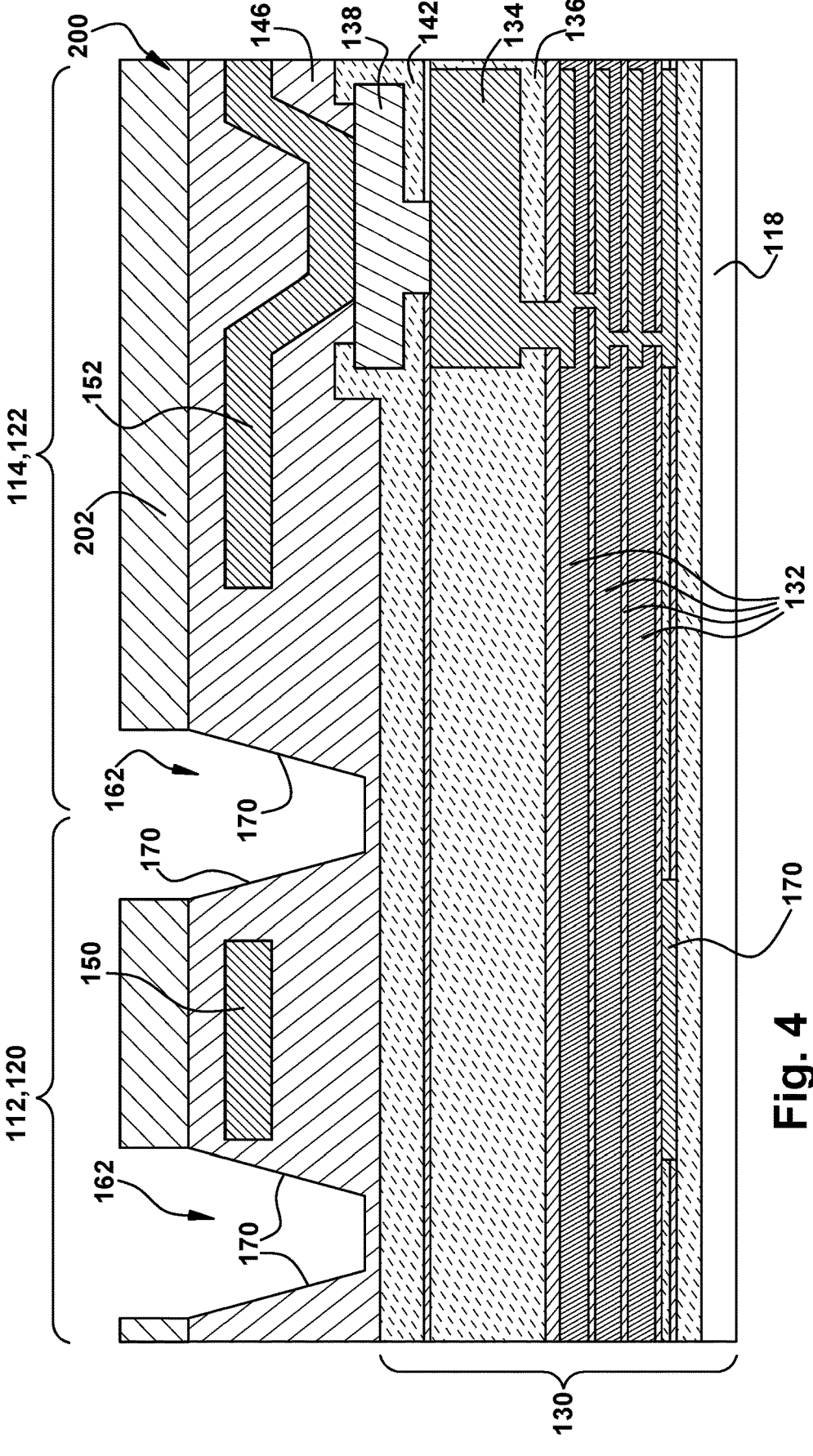
FIG. 4 shows a cross-sectional view of an initial structure for forming a galvanic isolation including forming a trench, according to embodiments of the disclosure.
Figure 5:
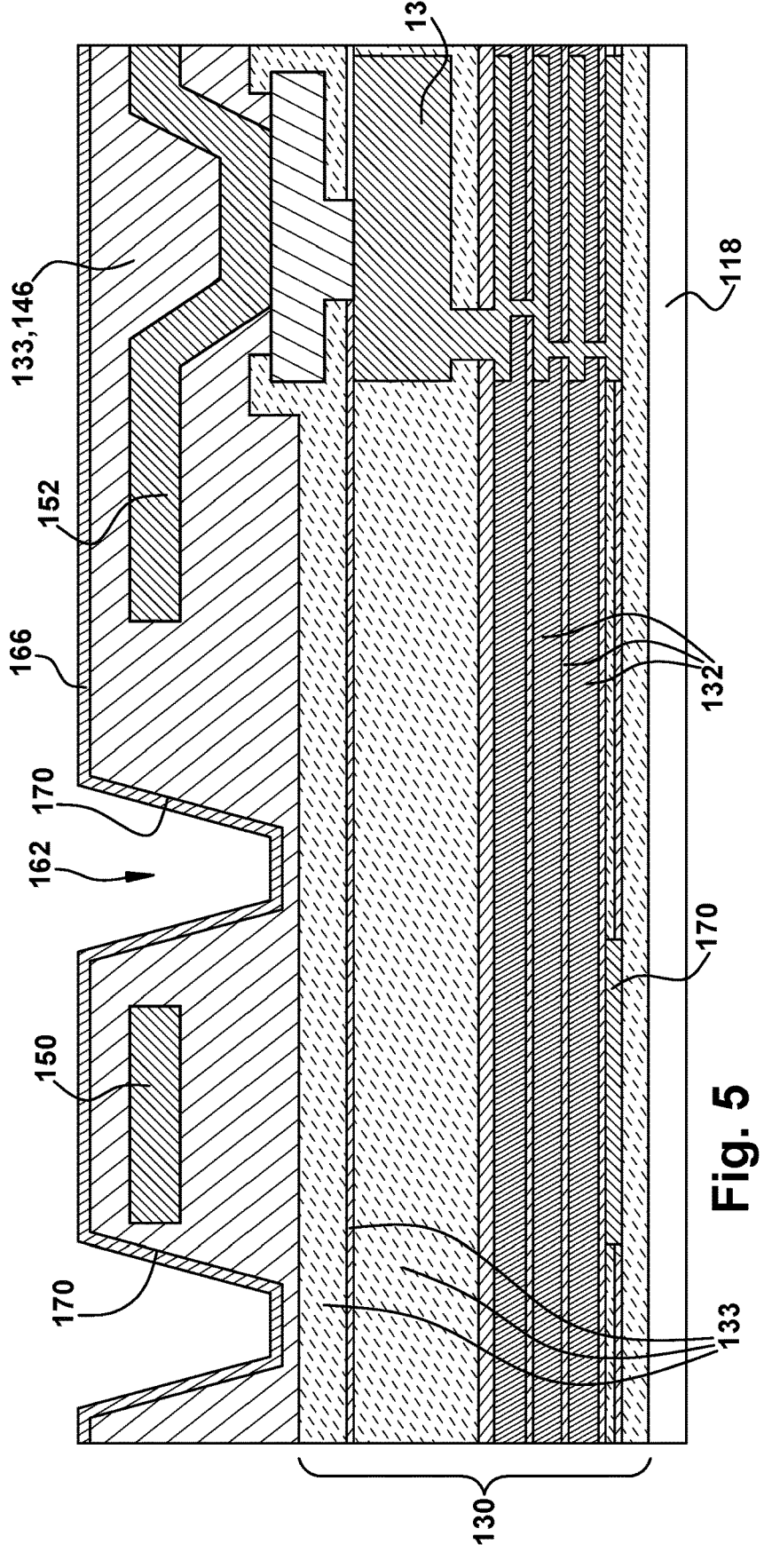
FIG. 5 shows a cross-sectional view of forming an insulator layer in the trench of FIG. 4, according to embodiments of the disclosure.
Figure 6:
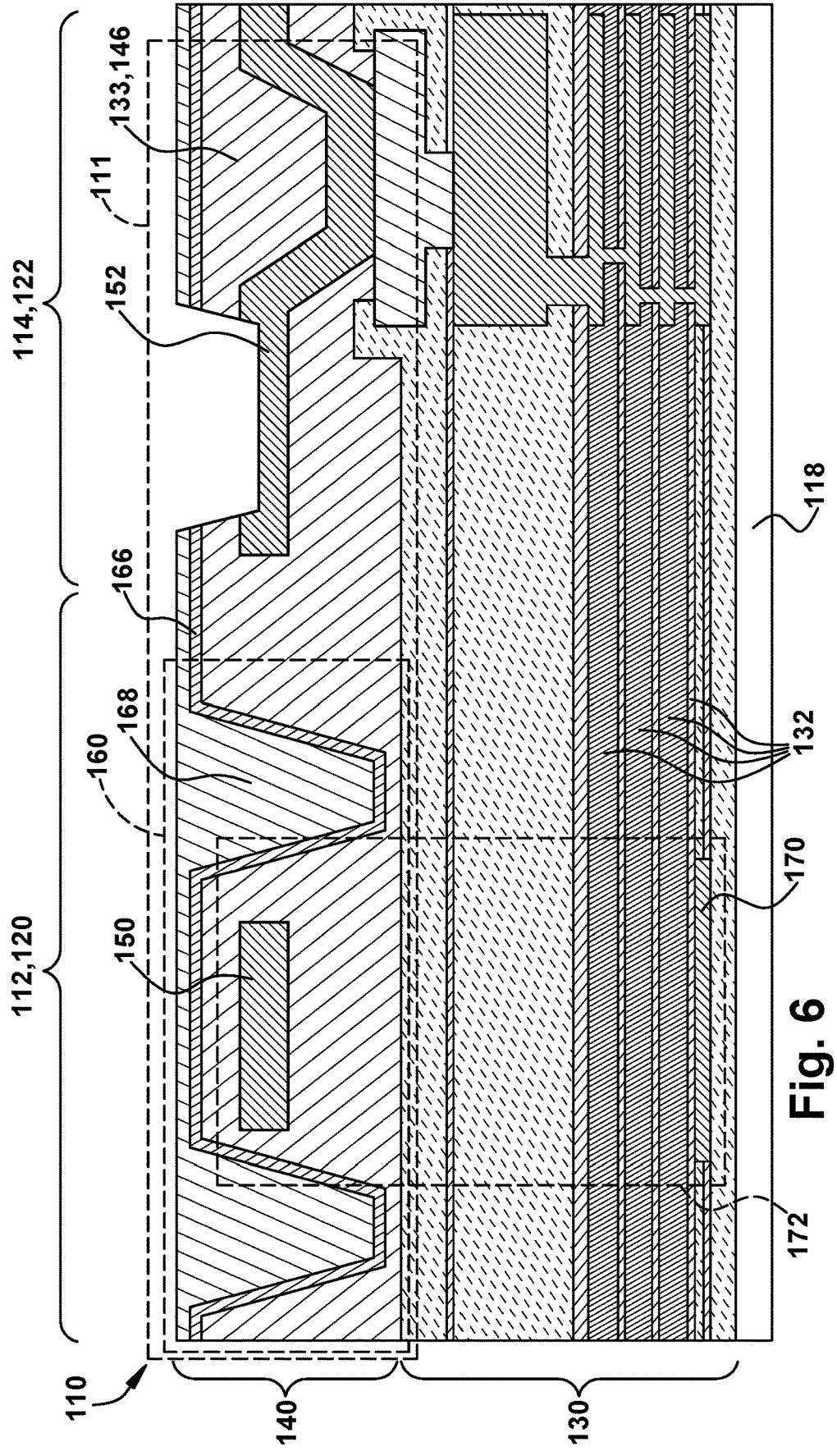
FIG. 6 shows a cross-sectional view of forming another insulator layer in the trench of FIG. 4, according to embodiments of the disclosure.

Referring to FIGS. 4-6, cross-sectional views of a method according to embodiments of the disclosure are shown. FIG. 4 shows an initial structure 200. Initial structure 200 includes logic region 114 including any devices (not shown) and BEOL interconnect layers 130 thereover. At this stage, I/O pads 138 have been formed, and metal wires 148 in first insulator layer 146 have been formed. Metal wires 148 include, among other structure not shown, first RDL electrode 150 and second RDL electrode 152 in first insulator layer 146. First RDL electrode 150 and second RDL electrode 152 are laterally spaced, e.g., by distance S (FIG. 1). The afore-mentioned structures can be formed using any now known or later developed processes, e.g., conventional CMOS processes. In contrast to conventional processes, FIG. 4 also shows forming a trench 162 into first insulator layer 146 between first RDL electrode 150 and second RDL electrode 152 in first insulator layer 146. Trench 162 can be formed using a patterned mask 202 and using an appropriate etching process for first insulator layer 146, e.g., a reactive ion etch. Trench 162 does not expose BEOL interconnect layers 130, but extends sufficiently below RDL metal electrodes 150, 152 so isolation 160 that is eventually formed therein provides the desired dielectric strength and electrical isolation. Mask 202 may be removed using any appropriate ashing process.

FIGS. 5-6 show filling trench 162 with at least one second insulator layer 166, 168. FIG. 5 shows forming at least one nitride layer 166. Each second insulator layer 166, 168 has a higher dielectric constant than first insulator layer 146. In one embodiment, first insulator layer 146 may include a polyimide, and second insulator layer(s) may include at least one nitride layer 166 and at least one oxide layer 168. While shown as not filling trench 162, a single, second insulator layer of, for example, nitride or oxide, may fill an entirety of trench 162, so isolation break 160 only includes a single insulator layer. In the example shown, nitride layer(s) 166 just coats sidewall 170 of trench 162, and FIG. 6 shows forming at least one oxide layer 168 over nitride layer(s) 166, filling a remaining portion of trench 162 (FIG. 5). The filling step(s) may include any appropriate deposition technique for the material formed. Any appropriate planarization may be carried out thereafter to remove excess material, e.g., chemical mechanical polishing (CMP).

First insulator layer 146 and each second insulator layer 166, 168 are between first RDL electrode 150 and second RDL electrode 152, creating a capacitor and horizontal portion 111 of galvanic isolation 110. First RDL electrode 150 is in first voltage domain 120, and second RDL electrode 122 is in a second, different voltage domain 122. As partially shown in FIG. 1, any conventional packaging processes may be carried out after isolation 110 formation, e.g., solder bump 144 formation, wire bonding, etc.

Galvanic isolation 110 provides a stronger (e.g., kilo-Volt level) galvanic isolation by increasing capacitive coupling using isolation break 160 and RDL electrodes 150, 152 in a horizontal portion thereof in FBEOL interconnect layers 133. Isolation 110 provides stronger protection than available with more or thicker BEOL interconnect layers 132. The horizontal (lateral) portion 111 of isolation 110 also prevents lateral spiking of the high voltage contact on I/O pad 138. First insulator layer 146, which can be a polyimide packaging layer, can be made thinner than conventionally used, or can be made thicker to obtain higher galvanic isolation, when required. The formation process illustrated in FIGS. 4-6 is compatible with CMOS processing but has lower cost than increasing BEOL interconnect layer 132 thicknesses or numbers.

The methods as described above are used in the fabrication of integrated circuit chips. The resulting integrated circuit chip packages can be integrated with other chip packages, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
forming a trench into a first insulator layer between a first redistribution layer (RDL) electrode and a second RDL electrode in the first insulator layer, the first RDL electrode and the second RDL electrode being laterally spaced; and
filling the trench with at least one second insulator layer, wherein the first insulator layer and the at least one second insulator layer are between the first RDL electrode and the second RDL electrode,
wherein the first RDL electrode is in a first voltage domain, and the second RDL electrode is in a second, different voltage domain.

2. The method of claim 1, wherein the at least one second insulator layer has a higher dielectric constant than the first insulator layer.

3. The method of claim 1, wherein the first insulator layer includes a polyimide, and the at least one second insulator layer includes at least one nitride layer and at least one oxide layer.

4. A method comprising:
forming a trench into a first insulator layer between a first redistribution layer (RDL) electrode and a second RDL electrode in the first insulator layer, the first RDL electrode and the second RDL electrode being laterally spaced; and
filling the trench with at least one second insulator layer, wherein the at least one second insulator layer has a higher dielectric constant than the first insulator layer, wherein the first insulator layer and the at least one second insulator layer are between the first RDL electrode and the second RDL electrode,
wherein the first RDL electrode is in a first voltage domain, and the second RDL electrode is in a second, different voltage domain, and
wherein the first insulator layer includes a polyimide, and the at least one second insulator layer includes at least one nitride layer and at least one oxide layer.

* * * * *